(12) United States Patent
Inagaki et al.

(10) Patent No.: US 9,655,242 B2
(45) Date of Patent: May 16, 2017

(54) PRINTED WIRING BOARD (71) Applicant: IBIDEN CO., LTD., Ogaki-shi (JP)

(72) Inventors: Yasushi Inagaki, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/971,309

(22) Filed: Dec. 16, 2015

(65) Prior Publication Data

US 2016/0174372 A1 Jun. 16, 2016

(30) Foreign Application Priority Data

Dec. 16, 2014 (JP) .................................. 2014-253633

(51) Int. Cl.
*H05K 1/11* (2006.01)
*H01L 23/498* (2006.01)
*H01L 23/538* (2006.01)
*H05K 3/46* (2006.01)

(52) U.S. Cl.
CPC ........ *H05K 1/113* (2013.01); *H01L 23/49822* (2013.01); *H01L 23/49827* (2013.01); *H01L 23/5383* (2013.01); *H01L 23/5384* (2013.01); *H05K 1/111* (2013.01); *H01L 2224/0401* (2013.01); *H01L 2224/16227* (2013.01); *H01L 2224/16235* (2013.01); *H01L 2224/16237* (2013.01); *H01L 2924/15192* (2013.01); *H01L 2924/15313* (2013.01); *H01L 2924/18161* (2013.01); *H05K 3/4682* (2013.01); *H05K 2201/10674* (2013.01); *Y02P 70/611* (2015.11)

(58) Field of Classification Search
CPC ............... H05K 3/24; H05K 3/18; H05K 3/46

USPC .................. 174/261, 262, 263, 251; 361/750
See application file for complete search history.

(56) References Cited

U.S. PATENT DOCUMENTS

| 9,313,904 | B2 * | 4/2016 | Kaneko | .................. | H05K 3/465 |
| 2007/0025091 | A1 * | 2/2007 | Shimada | ................ | H05K 3/387 |
| | | | | | 361/750 |
| 2008/0264684 | A1 * | 10/2008 | Kang | ..................... | H05K 3/205 |
| | | | | | 174/262 |

(Continued)

FOREIGN PATENT DOCUMENTS

JP 2010-067887 A 3/2010

*Primary Examiner* — Timothy Thompson
*Assistant Examiner* — Michael F McAllister
(74) *Attorney, Agent, or Firm* — Oblon, McClelland, Maier & Neustadt, L.L.P.

(57) ABSTRACT

A printed wiring board includes a first insulating layer having concave portions on first surface of the first insulating layer, a first conductor layer including first circuits formed in the concave portions, a second conductor layer including second circuits on second surface of the first insulating layer, a first via conductor connecting the first and second conductor layers, and a second insulating layer formed on the second surface of the first insulating layer and covering the second conductor layer. Each first circuit has upper, lower and side surfaces such that the upper surface is exposed from the first insulating layer and the side and lower surfaces are not roughened surfaces, each second circuit has top, back and side surfaces such that the side and back surfaces are roughened surfaces, and a thinnest first circuit has a line width L1 smaller than a line width L2 of a thinnest second circuit.

20 Claims, 7 Drawing Sheets

(56) References Cited

U.S. PATENT DOCUMENTS

| | | | |
|---|---|---|---|
| 2009/0229862 A1* | 9/2009 | Nakamura | H01L 23/49822 174/251 |
| 2010/0139968 A1* | 6/2010 | Takenaka | H01L 23/49822 174/263 |
| 2013/0056362 A1* | 3/2013 | Tachibana | H05K 3/384 205/125 |

* cited by examiner

PRINTED WIRING BOARD

CROSS-REFERENCE TO RELATED APPLICATIONS

The present application is based upon and claims the benefit of priority to Japanese Patent Application No. 2014-253633, filed Dec. 16, 2014, the entire contents of which are incorporated herein by reference.

BACKGROUND OF THE INVENTION

Field of the Invention

The present invention relates to a printed wiring board that includes a resin insulating layer and a conductor layer embedded in the resin insulating layer.

Description of Background Art

Japanese Patent Laid-Open Publication No. 2010-67887 describes a wiring board. The wiring board of Japanese Patent Laid-Open Publication No. 2010-67887 has an outermost insulating layer, a pad that is embedded in the outermost insulating layer, a wiring layer that is formed on the outermost insulating layer, and a via that penetrates the outermost insulating layer and connects the pad and the wiring layer. A side surface of the pad and a surface of the pad that is in contact with the via are roughened. The entire contents of this publication are incorporated herein by reference.

SUMMARY OF THE INVENTION

According to one aspect of the present invention, a printed wiring board includes a first resin insulating layer having concave portions formed on a first surface of the first resin insulating layer, a first conductor layer including first conductor circuits formed in the concave portions of the first resin insulating layer, respectively, a second conductor layer including second conductor circuits formed on a second surface of the first resin insulating layer on the opposite side with respect to the first surface of the first resin insulating layer, a first via conductor formed in the first resin insulating layer such that the first via conductor is penetrating through the first resin insulating layer and connecting the first conductor layer and the second conductor layer, and a second resin insulating layer formed on the second surface of the first resin insulating layer such that the second resin insulating layer is covering the second conductor layer. Each of the first conductor circuits has an upper surface, a lower surface and two side surfaces between the upper surface and the lower surface such that the upper surface is exposed from the first surface of the first resin insulating layer and that the side surfaces and the lower surface are not roughened surfaces, each of the second conductor circuits has a top surface, a back surface and two side surfaces between the top surface and the back surface such that the side surfaces and the back surface are roughened surfaces, and the first conductor circuits include a thinnest first conductor circuit such that the thinnest first conductor circuit has a line width L1 which is smaller than a line width L2 of a thinnest second conductor circuit of the second conductor circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1A:
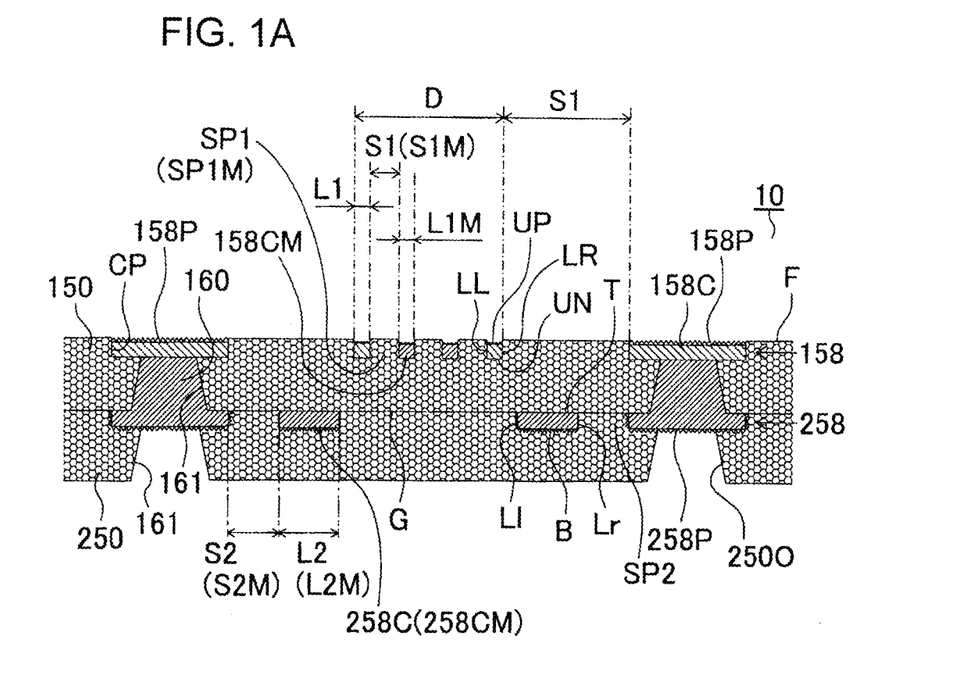
FIG. 1A is a cross-sectional view of a printed wiring board according to a first embodiment of the present invention.

FIG. 1A illustrates a cross section of a printed wiring board 10 of a first embodiment. As illustrated in FIG. 1A, the printed wiring board 10 is formed to include a first resin insulating layer 150 that has a first surface (F) and a second surface (G) that is on an opposite side of the first surface (F), a first conductor layer 158 and a second conductor layer 258 that sandwich the first resin insulating layer 150, first via conductors 160 that penetrate the first resin insulating layer 150 and connect the first conductor layer 158 and the second conductor layer 258, and a second resin insulating layer 250 that is formed on the second surface (G) of the first resin insulating layer 150 and on the second conductor layer 258. The first conductor layer 158 is embedded in the first resin insulating layer 150, and the second conductor layer 258 is formed on the second surface (G) of the first resin insulating layer. The second conductor layer 258 projects from the second surface (G) of the first resin insulating layer.

As illustrated in FIG. 1A, the first resin insulating layer 150 has multiple concave portions (CP) on the first surface (F) side of the first resin insulating layer 150. The first conductor layer 158 is formed in the concave portions (CP). The first conductor layer 158 is formed of multiple first conductor circuits (158C). The first conductor circuits (158C) are respectively formed in the concave portions (CP).

The first conductor circuits (158C) each have an upper surface (UP) that faces toward the first surface (F) of the first resin insulating layer 150, a lower surface (UN) that faces toward the second surface (G) of the first resin insulating layer 150, and two side surfaces (LR, LL) between the upper surface (UP) and the lower surface (UN). In FIG. 1A, a right side surface is the side surface (LR), and a left side surface is the side surface (LL). The first conductor circuits (158C) each have a line width (L1). The line width (L1) is a distance between the side surface (LR) and the side surface (LL). Among the first conductor circuits (158C), a thinnest first conductor circuit is a smallest first conductor circuit (158CM). A line width (L1M) of the smallest first conductor circuit (158CM) is 2.5 µm or more and 7.5 µm or less. The line width (L1M) of the smallest first conductor circuit (158CM) is a predetermined value in a range from 2.5 µm to 7.5 µm.

The first conductor circuits (158C) are embedded in the first resin insulating layer 150. The first conductor layer 158 is embedded in the first resin insulating layer 150. In FIG. 1A, the first conductor circuits (158C) are completely embedded in the first resin insulating layer 150. In FIG. 1A, the upper surface (UP) is recessed from the first surface (F). The upper surface (UP) is positioned between the first surface (F) and the second surface (G). The upper surface (UP) is exposed from the first surface (F). The first resin insulating layer 150 is not formed on the upper surface (UP). The upper surface (UP) is not in contact with the first resin insulating layer 150. It is also possible that the upper surface (UP) is positioned on the same plane as the first surface.

The side surfaces (LR, LL) and the lower surface (UN) of each of the first conductor circuits (158C) are covered by the first resin insulating layer 150. The side surfaces (LR, LL) and the lower surface (UN) are in contact with the first resin insulating layer 150.

The first conductor layer has a first space (SP1) between each pair of adjacent first conductor circuits. The first space (SP1) has a width (S1). The width (S1) of the first space is a distance between a side wall (LR) of one first conductor circuit and a side wall (LL) of another first conductor circuit that is adjacent to the one first conductor circuit. Among first spaces (SP1), a most narrow first space (SP1) is a smallest first space (SP1M). A width (S1M) of the smallest first space (SP1M) is a predetermined value in a range from 2.5 µm to 7.5 µm. The width (S1M) is 2.5 µm or more and 7.5 µm or less. The line width (L1) and the width (S1) of the first space are obtained from a cross section of the first conductor layer that is obtained by cutting the first conductor layer in a plane perpendicular to a propagation direction of data transmitted via the first conductor circuit. Line widths and space widths of other conductor layers are obtained using the same method.

The first conductor layer 158 has a region (D) where smallest first conductor circuits (158CM) and smallest first spaces (SP1M) are alternately formed. In FIG. 1A, the region (D) is formed in a substantially central portion of the printed wiring board 10. In FIG. 1A, the line width (L1M) is 5 µm, and the width (S1M) is 5 µm.

The side surfaces (LR, LL) and the lower surface (UN) of each of the first conductor circuits do not have a rough surface. The side surfaces (LR, LL) and the lower surface (UN) of each of the first conductor circuits are not roughened. It is preferable that the upper surface (UP) of each of the first conductor circuits have a rough surface. It is preferable that the upper surface (UP) of each of the first conductor circuits be roughened.

Figure 1B:
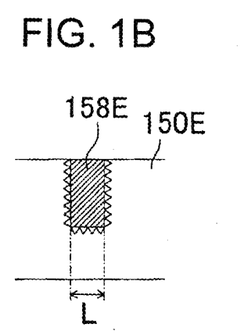
FIG. 1B-1E are schematic diagrams of conductor circuits of a reference example.
Figure 1C:
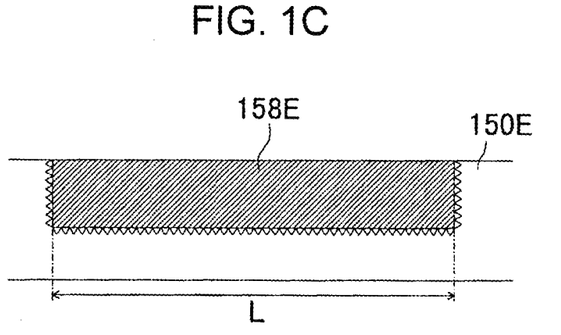
Figure 1D:
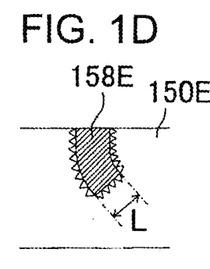
Figure 1E:
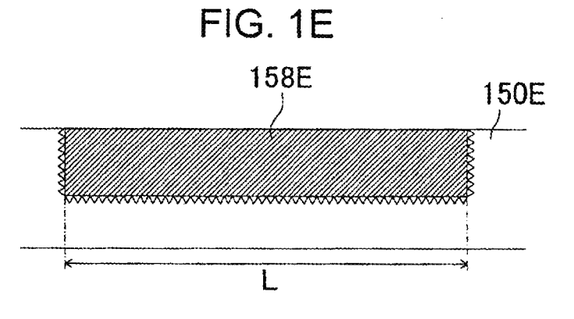

FIG. 1B-1E illustrate conductor circuits (158E) of a reference example. Similar to the first conductor circuits (158C) of the printed wiring board 10 of FIG. 1A, the conductor circuits (158E) of the reference example of FIG. 1B-1E are embedded in a resin insulating layer (150E). FIGS. 1B and 1C are cross-sectional views of the conductor circuits (158E) at a normal temperature. FIGS. 1D and 1E are cross-sectional views of the conductor circuits (158E) at a high temperature. A line width (L) of the conductor circuit (158E) is the same in FIGS. 1B and 1D, and is a predetermined value in a range from 2.5 µm to 7.5 µm. For example, the line width (L) of the conductor circuit (158E) of FIGS. 1B and 1D is 7.5 µm. A line width (L) of the conductor circuit (158E) of FIGS. 1C and 1E is 10 µm. Further, side surfaces and lower surfaces of the conductor circuits (158E) illustrated in FIG. 1B-1E are roughened.

Shapes of the conductor circuits (158E) illustrated in FIG. 1B-1E are prospective views. A material of the conductor circuits (158E) and a material of the resin insulating layer (150E) are different and thus thermal expansion coefficients of the two are different. Therefore, when temperature of the printed wiring board rises from normal temperature to high temperature, a stress acts on an interface between the conductor circuits (158E) and the resin insulating layer (150E). The line width (L) of the conductor circuit (158E) of FIG. 1B is small and thus the conductor circuit (158E) has a low strength. Therefore, when the temperature of the printed wiring board 10 becomes high, as illustrated in FIG. 1D, the conductor circuit (158E) is expected to bend due to the stress. Due to heat cycles, changing from the shape of FIG. 1B to the shape of FIG. 1D and changing from the shape of FIG. 1D to the shape of FIG. 1B are repeated. Concave and convex portions of rough surfaces that are formed on the side surfaces and the lower surface are finely formed. Therefore, due to the repetition of the shape change, cracking of the rough surfaces is expected to occur. The rough surfaces are formed of a conductive material. Therefore, when cracking occurs in the rough surfaces, migration and cracking of the resin insulating layer (150E) occur. Therefore, when the line width (L1) of the first conductor circuits (158C) of the present embodiment is 7.5 µm or less, it is preferable that the side surfaces (LL, LR) and the lower surface (UN) of each of the first conductor circuits (158C) be not roughened. It is preferable that the side surfaces (LL, LR) and the lower surface (UN) of the first conductor circuits (158C) having the line width (L1) of 7.5 µm or less do not have a rough surface. When the line width (L1) of the first conductor circuits (158C) is less than 2.5 µm, strength of the first conductor circuits (158C) is significantly reduced. Therefore, a deformation amount of the first conductor circuits (158C) is increased. When the first conductor circuits having the line width (L1) of less than 2.5 µm have rough surfaces, a stress is concentrated on the concave portions or convex portions of the rough surfaces. Therefore, it is presumable that cracking occurs from concave portions or convex portions to the first conductor circuits (158C). Further, when the first conductor circuits having the line width (L1) of less than 2.5 µm do not have rough surfaces, deformation of the first conductor circuits (158C) is large, and thus the first resin insulating layer 150 is peeled off from the first conductor circuits (158C). Cracking is expected to occur in the first resin insulating layer 150. Insulation reliability is reduced due to the cracking. Disconnection of the conductor layer occurs due to the cracking. Such problems are expected to occur. Therefore, the line width (L1M) of the smallest first conductor circuit (158CM) has a predetermined value in a range from 2.5 µm to 7.5 µm, and the side surfaces (LR, LL) and the lower surface (UN) of the first conductor circuit (158CM) are not roughened.

When cracking of the rough surfaces occurs, fine conductive substances from the first conductor circuits (158C) are mixed into the resin insulating layer 150 in the spaces (SP1). These fine conductive substances affect migration and short circuiting between adjacent first conductor circuits (158C). When the width (S1) of the first space is large, even when cracking of the rough surfaces occurs, a problem is unlikely to occur. However, when the width (S1) of the first space is 7.5 µm or less, the printed wiring board is affected by the cracking of the rough surfaces. Therefore, when the width (S1) of the first space is 7.5 µm or less, it is preferable that the side surfaces (LR, LL) and the lower surface (UN) of each of the first conductor circuits (158C) be not roughened. Further, when the width (S1) of the first space is 5 µm or less, an amount of the resin insulating layer 150 that is formed in the first space is reduced. Strength of the resin insulating layer 150 in the first space (SP1) is reduced. Therefore, when the side surfaces (LR, LL) and the lower surface (UN) of the first conductor circuit have a rough surface, a stress is concentrated on concave and convex portions of the rough surface. Therefore, due to the concave and convex portions of the rough surface, cracks are likely to occur in the resin insulating layer 150 in the first space (SP1). Short circuiting between adjacent first conductor circuits (158C) occurs due to migration and the like via the cracks. Therefore, when the width (S1) of the first space (SP1) is 5 µm or less, it is preferable that the side surfaces (LL, LR) and the lower surface (UN) of each of the first conductor circuits (158C) be not roughened. When the width (S1) of the first space (SP1) is less than 2.5 µm, due to the first conductor circuits (158C) that sandwich the resin insulating layer 150 in the first space (SP1), the resin insulating layer 150 in the first space (SP1) is subjected to repeated pressure due to heat cycles. Therefore, when the width (S1) of the first space (SP1) is less than 2.5 µm, even when the side surfaces (LR, LL) and the lower surface (UN) of the first conductor circuits (158C) do not have a rough surface, cracking is likely to occur in the resin insulating layer 150 in the first space (SP1). Therefore, the smallest first space (SP1M) has the predetermined width (S1M) in a range from 2.5 µm to 7.5 µm, and the side surfaces (LR, LL) and the lower surface (UN) of the smallest first conductor circuit (158CM) are not roughened.

The line width (L) of the conductor circuit (158E) of FIG. 1E is 10 µm and thus the conductor circuit (158E) has a high strength. Therefore, even when the temperature of the printed wiring board becomes high, the conductor circuit (158E) hardly bends. Therefore, in the printed wiring board 10 illustrated in FIG. 1A, the side surfaces (LR, LL) and the lower surface (UN) of the first conductor circuits (158C) having the line width (L1) of 10 µm or more may be roughened. The side surfaces (LL, LR) and the lower surface (UN) of the first conductor circuits (158C) having the line width (L1) of 10 µm or more may have a rough surface.

It is also possible that the side surfaces (LR, LL) and the lower surface (UN) of the smallest first conductor circuit (158CM) having the line width of 7.5 µm or less are not roughened, and the side surfaces (LR, LL) and the lower surface (UN) of each of the first conductor circuits (158C) other than the first conductor circuit (158CM), having the line width of 10 µm or more, are roughened. However, a process for doing so becomes complicated. Therefore, it is preferable that the side surfaces (LR, LL) and the lower surface (UN) of each of all the first conductor circuits (158C) in the first conductor layer 158 be not roughened.

As illustrated in FIG. 1A, the second conductor layer 258 projects from the second surface (G) of the first resin insulating layer 150. The second conductor layer 258 is formed of multiple second conductor circuits (258C). The second conductor circuits (258C) each have a top surface (T), a back surface (B) that is on an opposite side of the top surface (T), and two side surfaces (LR, LL) between the top surface (T) and the back surface (B). In FIG. 1A, the side surface (LR) is a right side surface, and the side surface (LL) is a left side surface. The top surface (T) is in contact with the second surface (G). The second conductor circuits (258C) each have a line width (L2). The line width (L2) is a distance between the side surface (LR) and the side surface (LL). Among the second conductor circuits (258C), a thinnest second conductor circuit is a smallest second conductor circuit (258CM). A line width (L2M) of the smallest second conductor circuit (258CM) is a predetermined value in a range from 10 µm to 50 p.m. The line width (L2M) of the smallest second conductor circuit (258CM) is 10 µm or more and 50 µm or less. The value of the line width (L1M) of the smallest first conductor circuit is smaller than the value of the line width (L2M) of the smallest second conductor circuit.

The first conductor layer 158 is embedded in the first resin insulating layer 150, and the second conductor layer 258 is not embedded in the first resin insulating layer. Therefore, when strengthening of the first resin insulating layer by the first conductor layer 158 and strengthening of the first resin insulating layer 150 by the second conductor layer 258 are compared to each other, efficiency of the strengthening of the first conductor layer 158 is high. Therefore, when the first conductor layer 158 and the second conductor layer 258 are the same, warpage of the printed wiring board 10 is increased. In order to reduce the warpage, in the printed wiring board 10, the value of the line width (L1M) is smaller than the value of the line width (L2M).

The second conductor layer 258 has a second space (SP2) between each pair of adjacent second conductor circuits (258C). The second space has a width (S2). Among the widths (S2), a smallest width is a smallest second space (SP2M). The smallest second space (SP2M) has a width (S2M). The width (S2M) is 10 µm or more and 50 µm or less. The value of the width (S1M) is smaller than the value of the width (S2M).

The side surfaces (LR, LL) and the back surface (B) of each of all of the second conductor circuits are roughened. The line width (L2M) is 10 µm or more. Therefore, even when the side surfaces (LR, LL) and the back surface (B) have a rough surface, it does not cause a problem.

The first resin insulating layer 150 has the first conductor layer 158 and openings 161 for the first via conductors 160 for connecting to the second conductor layer 258. The first via conductors 160 are respectively formed in the openings 161. The first via conductors 160 respectively connect the lower surfaces (UN) of the first conductor circuits (158C) to the top surfaces (T) of the second conductor circuits (258C). A diameter of each first via conductor 160 on a side connected to a top surface (T) is larger than a diameter of the first via conductor on a side connected to a lower surface (UN). Generally, the first via conductors 160 are each reduced in diameter from the second surface (G) toward the first surface (F). Therefore, a volume of each via conductor 160 on the second surface (G) side is larger than a volume of the via conductor 160 on the first surface (F) side. Warpage of the printed wiring board 10 is reduced.

The second resin insulating layer 250 is formed on the second surface (G) of the first resin insulating layer 150 and on the second conductor layer 258. The second resin insulating layer 250 has openings (250O) that expose the second conductor layer 258. In FIG. 1A, the second resin insulating layer 250 is a lower side solder resist layer 250. Portions of the conductor layer 258 that are exposed from the openings (250O) are lower side pads (258P). Solder bumps are respectively formed on the lower side pads (258P). The printed wiring board 10 is mounted on a motherboard via the solder bumps on the lower side pads (258P).

First Applied Example

Figure 2A:
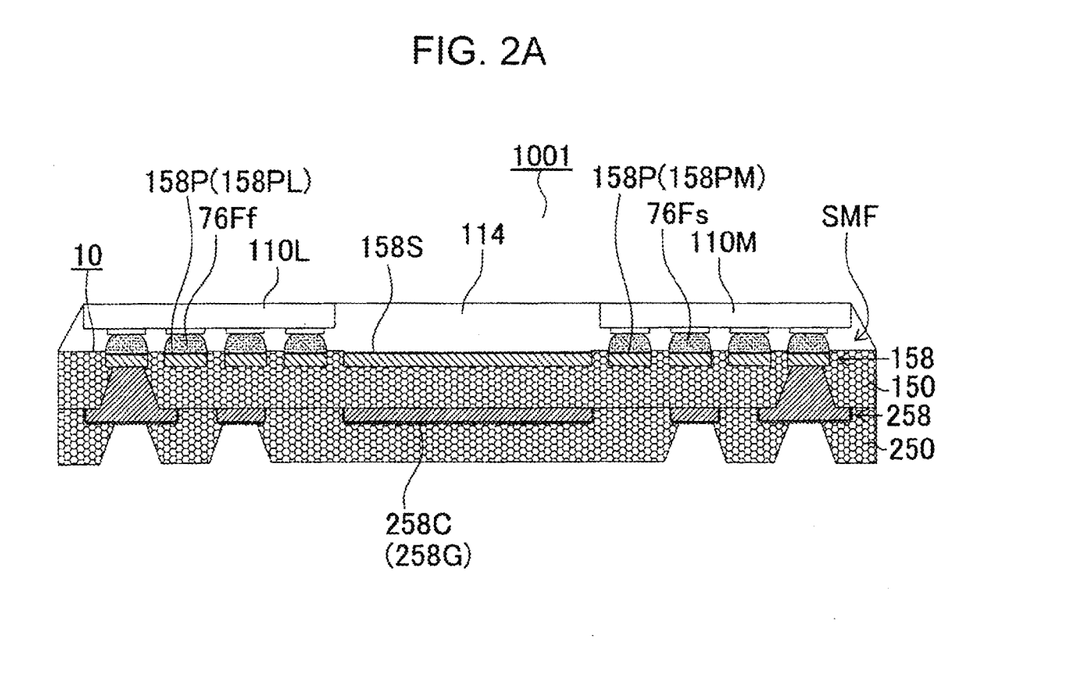
FIG. 2A is a cross-sectional view of a first applied example.

FIG. 2A illustrates a cross section of a first applied example 1001 of the printed wiring board 10. The first applied example 1001 is formed by the printed wiring board 10 and electronic components (110L, 110M) that are mounted on a mounting surface (SMF) of the printed wiring board 10. It is preferable that there are multiple electronic components in the first applied example 1001. In FIG. 1, the two electronic components (110L, 110M) are mounted on the printed wiring board. The electronic component (110L) is, for example, a logic IC, and the electronic component (110M) is a memory. The electronic components (110L, 110M) are mounted on the printed wiring board 10 via upper side pads (158P) (158PM, 158PL) that are included in the first conductor layer 158. The electronic component (110L) is mounted on the printed wiring board 10 via first upper side solder bumps (76Ff) that are respectively formed on the first upper side pads (158PL). The electronic component (110M) is mounted on the printed wiring board 10 via second upper side solder bumps (76Fs) that are respectively formed on the second upper side pads (158PM). Sealing resin 114 is formed between the electronic components (110L, 110M) and the printed wiring board 10. A material of the first upper side solder bumps (76Ff) on which the logic IC is mounted and a material of the second upper side solder bumps (76Fs) on which the memory is mounted are different. It is preferable that a melting point of the solder bumps on which the logic IC is mounted be lower than a melting point of the solder bumps on which the memory is mounted. For example, the electronic component (110L) and the electronic component (110M) can be separately mounted. A mounting yield is improved.

Figure 2B:
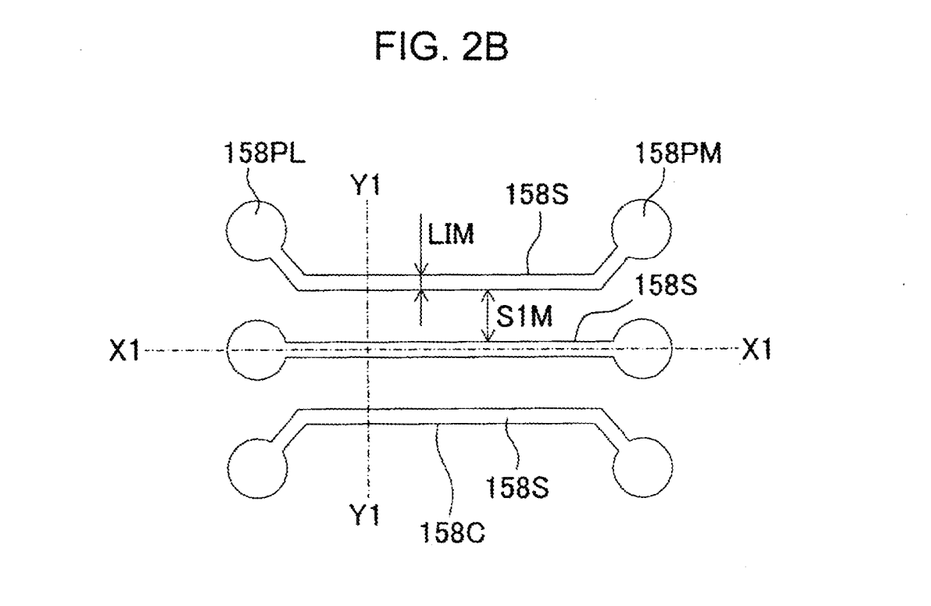
FIG. 2B is a plan view of dedicated wirings.

As illustrated in FIGS. 2A and 2B, the first conductor layer 158 has dedicated wirings (158S). FIG. 2B is a plan view and a schematic diagram of the dedicated wirings (158S). As illustrated in FIG. 2B, each dedicated wiring (158S) is a wiring that connects a first upper side pad (158PL) and a second upper side pad (158PM). One end of each dedicated wiring (158S) is connected to a first upper side pad (158PL) and the other end is connected to a second upper side pad (158PM). Data is transmitted from the electronic component (110L) to the electronic component (110M) via the dedicated wirings (158S). Data is transmitted from the electronic component (110M) to the electronic component (110L) via the dedicated wirings (158S). The dedicated wirings do not have any function other than data transmission between the first electronic component (110L) and the second electronic component (110M).

In the case where the printed wiring board 10 has the dedicated wirings (158S), the side walls (LR, LL) and the lower surface (UN) of each of the dedicated wirings (158S) are not roughened. The first conductor circuits (158C) other than the dedicated wirings (158S) in the first conductor layer are roughened. A wiring density of the first conductor layer is increased. The first conductor layer does not peel off from the first resin insulating layer. Cracking in the first resin insulating layer does not occur. Disconnection in the conductor layer does not occur.

As illustrated in FIG. 2B, among all of the dedicated wirings (158S), more than half of the dedicated wirings (158S) are formed by the smallest first conductor circuits (158CM). Further, among all of the first spaces (SP1) between the dedicated wirings (158S), more than half of the first spaces (SP1) are formed by the smallest first spaces (SP1M). As a result, sophisticated electronic components can be mounted on the printed wiring board 10. It is preferable that all of the dedicated wirings (158S) are formed by the smallest first conductor circuits (158CM) and all of the first spaces (SP1) between the dedicated wirings (158S) be formed by the smallest first spaces (SP1M). Even when sophisticated electronic components are mounted, a size of the first applied example is reduced.

As illustrated in FIG. 2A, second conductor circuits (258C) that are formed below the dedicated wirings (158S) are grounds (258G). Microstrip lines are formed by the dedicated wirings (158S) and the ground (258G) below the dedicated wirings (158S).

Second Embodiment

Figure 3A:
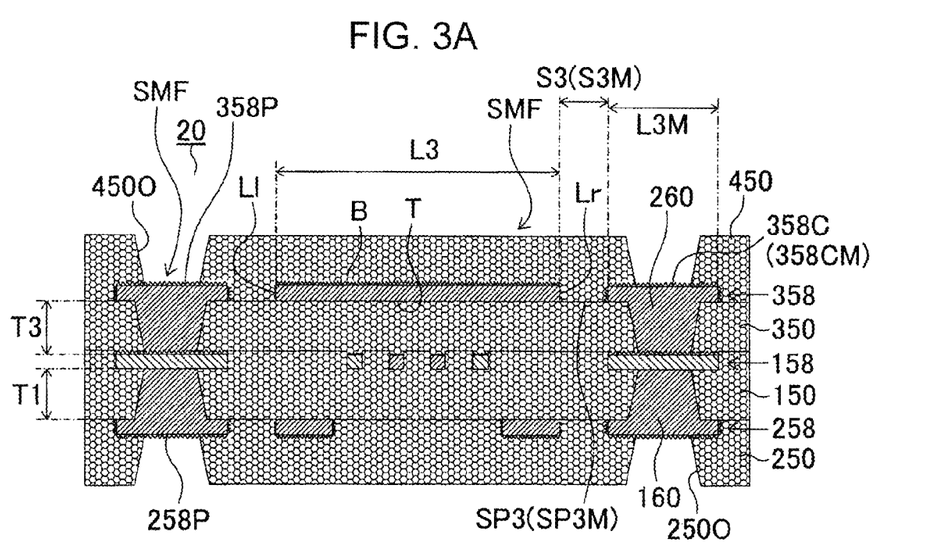
FIG. 3A is a cross-sectional view of a printed wiring board of a second embodiment.

FIG. 3A illustrates a cross-sectional view of a printed wiring board 20 of a second embodiment. The printed wiring board 20 of the second embodiment includes the printed wiring board 10 of the first embodiment illustrated in FIG. 1A, a third resin insulating layer 350 that is formed on the upper surface (UP) of the first conductor layer 158 of the printed wiring board 10 and on the first surface (F) of the first resin insulating layer 150, a third conductor layer 358 that is formed on the third resin insulating layer 350, and second via conductors 260 that penetrate the third resin insulating layer 350 and connect the first conductor layer 158 and the third conductor layer 358. The printed wiring board of the second embodiment may further have a fourth resin insulating layer 450 on the third resin insulating layer 350 and the third conductor layer 358. In the second embodiment, the fourth resin insulating layer 450 functions as an upper side solder resist layer. The third resin insulating layer 350 has a third surface and a fourth surface that is on an opposite side of the third surface. The fourth surface of the third resin insulating layer opposes the first surface of the first resin insulating layer. The third conductor layer is formed on the third surface.

As illustrated in FIG. 3A, the first conductor layer 158 is sandwiched by the first via conductors 160 and the second via conductors 260.

The third conductor layer 358 is the same as the second conductor layer 258. Therefore, the third conductor layer 358 is formed of multiple third conductor circuits (358C). The third conductor circuits (358C) each have a top surface (T), a back surface (B) that is on an opposite side of the top surface (T), and two side surfaces (LR, LL) between the top surface (T) and the back surface (B). In FIG. 3A, the side surface (LR) is a right side surface, and the side surface (LL) is a left side surface. The top surface (T) is in contact with the third surface of the third resin insulating layer. The third conductor circuits (358C) each have a line width (L3). The line width (L3) is a distance between the side surface (LR) and the side surface (LL). Among the third conductor circuits (358C), a thinnest third conductor circuit is a smallest third conductor circuit (358CM). A line width (L3M) of the smallest third conductor circuit (358CM) is a predetermined value in a range from 10 μm to 50 μm. The line width (L3M) of the smallest third conductor circuit (358CM) is 10 μm or more and 50 μm or less. The value of the line width (L1M) of the smallest first conductor circuit (158CM) is smaller than the value of the line width (L3M) of the smallest third conductor circuit (358CM). The width (S1M) of the smallest first space (SP1M) is smaller than a width (S3M) of a smallest third space (SP3M). The side surfaces (LR, LL) of each of the third conductor circuits (358C) are roughened. The back surface (B) of each of the third conductor circuits (358C) is roughened.

Similar to the printed wiring board 10 of the first embodiment, the printed wiring board 20 of the second embodiment has a mounting surface (SMF). The mounting surface (SMF) is formed on the upper surface (UP) of the first conductor layer 158. An electronic component is mounted on the printed wiring board 20 via the third conductor layer 358.

Second Applied Example

Figure 3B:
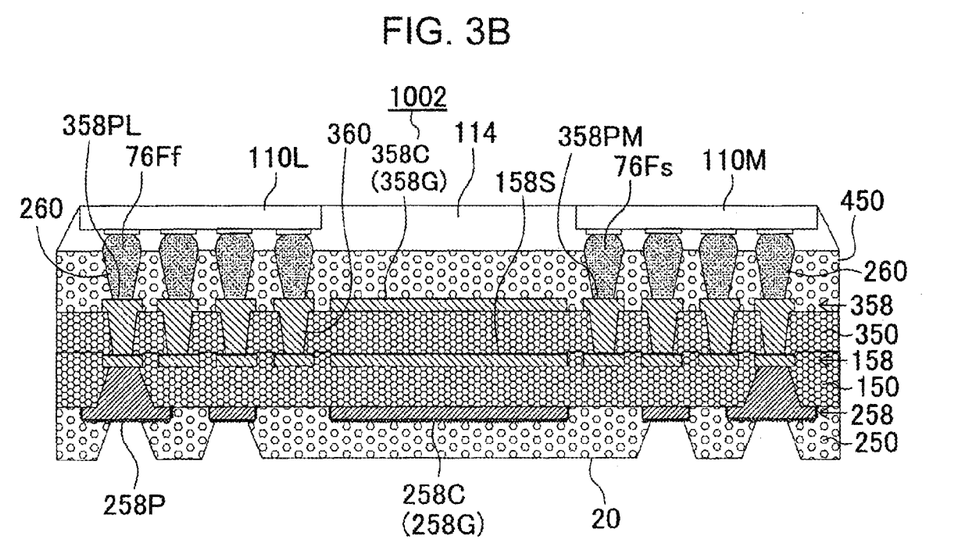
FIG. 3B is a cross-sectional view of a second applied example.

FIG. 3B illustrates a second applied example 1002. The second applied example 1002 is formed by the printed wiring board 20 of the second embodiment and electronic components (110L, 110M) that are mounted on the printed wiring board 20. It is preferable that there are multiple electronic components in the second applied example. In FIG. 3B, the two electronic components (110L, 110M) are mounted on the printed wiring board 20. The electronic component (110L) is, for example, a logic IC, and the electronic component (110M) is a memory. The electronic component (110L) is mounted on the printed wiring board 20 via first upper side solder bumps (76Ff) that are respectively formed on first upper side pads (358PL) that are included in the third conductor layer 358. The electronic component (110M) is mounted on the printed wiring board 20 via second upper side solder bumps (76Fs) that are respectively formed on second upper side pads (358PM) that are included in the third conductor layer 358. The first upper side pads (358PL) and the second upper side pads (358PM) are formed directly on the via conductors 260 that penetrate the third resin insulating layer. Sealing resin 114 is formed between the electronic components (110L, 110M) and the printed wiring board 20.

The first conductor layer 158 of the printed wiring board 20 of the second embodiment and the first conductor layer 158 of the printed wiring board 10 of the first embodiment are the same. Therefore, the printed wiring board 20 has the dedicated wirings (158S) that are formed in the printed wiring board 10. The dedicated wirings (158S) of the second applied example are formed between via conductors directly below the first upper side pads (358PL) and via conductors directly below the second upper side pads (358PM). The dedicated wirings (158S) of the second applied example are used only for data transmission between the first electronic component (110L) and the second electronic component (110M). One end of each dedicated wiring (158S) is connected to a first upper side pad (358PL) and the other end is connected to a second upper side pad (358PM).

The dedicated wirings (158S) are sandwiched by the grounds (258G) in the second conductor layer and grounds (358G) in the third conductor layer. By these, strip lines are formed.

In the second applied example 1002, a conductor layer that is embedded in the third resin insulating layer 350 does not exist. Therefore, the third resin insulating layer is formed in a substantially flat surface. Therefore, a distance between the first conductor layer 158 and the third conductor layer 358 is likely to be constant. Control of an impedance of the dedicated wirings (158S) is easily performed.

In the first applied example and the second applied example, the side surfaces of each of the first conductor circuits are not roughened. Therefore, the line width of each of the first conductor circuits can be controlled. The lower surface of each of the first conductor circuits is not roughened. Therefore, a thickness of each of the first conductor circuits can be controlled. Control of an impedance of the dedicated wirings (158S) is easily performed.

A metal film such as Ni/Au or Ni/Pd/Au can be formed on each of the upper side pads (158PL, 158PM, 358PL, 358PM) and the lower side pads (258P). Due to the metal film, oxidation of the pads (158PL, 158PM, 358PL, 358PM, 258P) is prevented.

In the printed wiring boards (10, 20) of the embodiments, the first conductor layer 158 is thinner than the conductor layers (258, 358) other than the first conductor layer. The conductor layers other than the first conductor layer have substantially the same thickness. In FIG. 1A, the first conductor layer 158 is thinner than the second conductor layer 258. In FIG. 3A, the first conductor layer 158 is thinner than the second conductor layer 258 and the third conductor layer 358. The second conductor layer 258 and the third conductor layer 358 have substantially the same thickness. For example, the thickness of the first conductor layer is ½ or less of the thickness of the conductor layers other than the first conductor layer and is 3 μm or more. For example, the thickness of the first conductor layer is about 5 μm, and the thickness of the conductor layers other than the first conductor layer is about 10 μm. As a result, fine conductor circuits can be formed in the first conductor layer 158. Sophisticated electronic components can be mounted on the printed wiring boards (10, 20).

Method for Manufacturing Printed Wiring Board and First Applied Example

A method for manufacturing the printed wiring board 10 of the first embodiment is illustrated in FIG. 4A-5D.

Figure 4A:
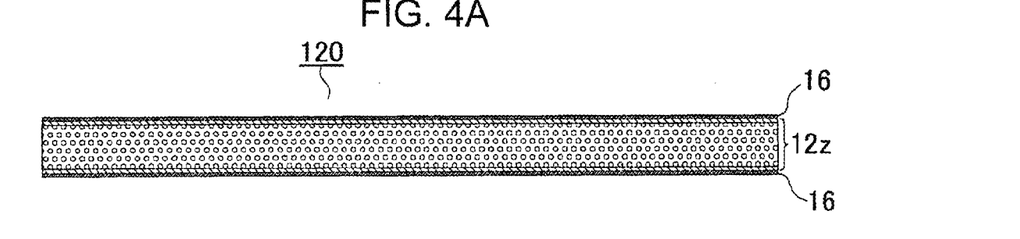
FIG. 4A-4E are process diagrams illustrating a method for manufacturing the printed wiring board of the first embodiment.

A substrate 120 is prepared that includes a double-sided copper-clad laminated plate (12z) and copper foils (16, 16) that are respectively laminated on both sides of the double-sided copper-clad laminated plate (12z) (FIG. 4A). The double-sided copper-clad laminated plate (12z) is a support plate.

Figure 4B:
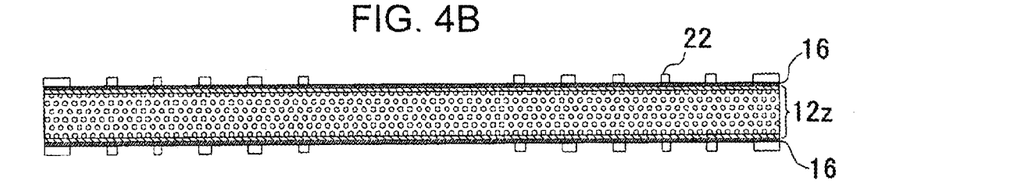
Figure 4C:
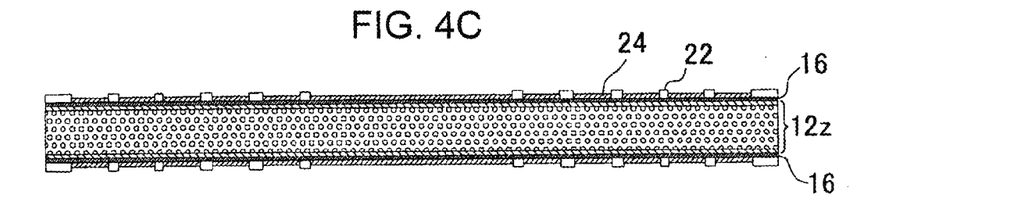

A plating resist 22 is formed on each of the copper foils (16, 16) of the substrate 120 (FIG. 4B). An electrolytic copper plating film 24 is formed by electrolytic copper plating on each of portions of the copper foils (16, 16) that are exposed from the plating resists (FIG. 4C).

Figure 4D:
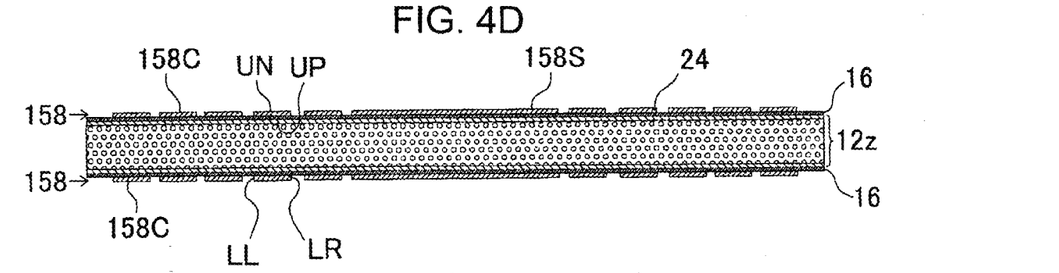
Figure 4E:
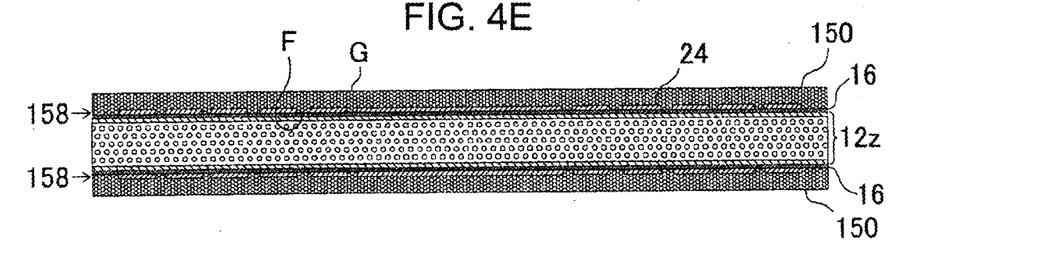
Figure 7A:
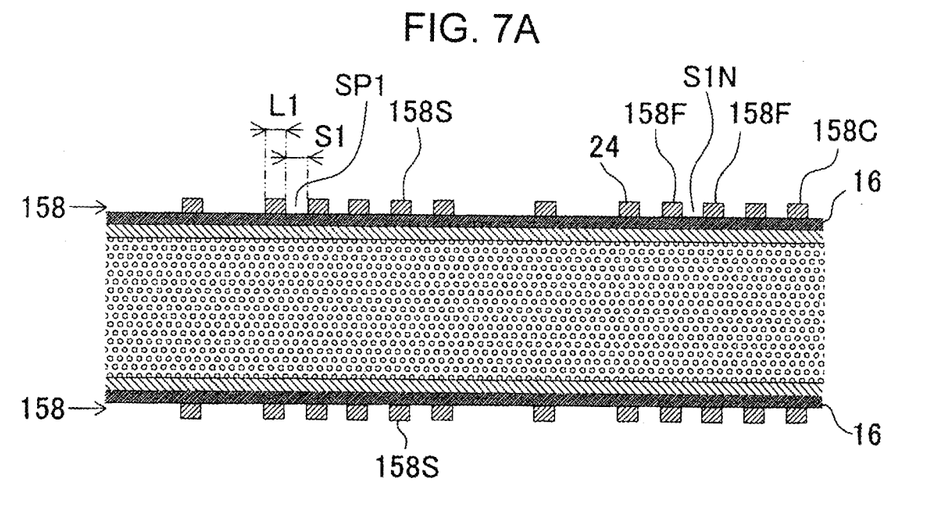
FIG. 7A is a cross-sectional view of dedicated wirings.

The plating resists are removed. The first conductor layer 158 is formed from the electrolytic copper plating film 24 (FIG. 4D). As illustrated in FIG. 4D, the first conductor layer 158 has the dedicated wirings (158S). FIG. 4D illustrates a cross section of the dedicated wirings (158S) between X1 and X1 in FIG. 2B. FIG. 7A illustrates a cross section of the dedicated wirings (158S) that are formed between Y1 and Y1 in FIG. 2B. In FIG. 7A, the first conductor circuits (158C) other than the dedicated wirings (158S) illustrated in FIG. 2B are also illustrated. The line width (L1) of each of the dedicated wirings (158S) is 2.5 μm or more and 7.5 μm or less. The width (S1) of the space (SP1) between adjacent dedicated wirings is 2.5 μm or more and 7.5 μm or less.

The first conductor layer 158 has the first conductor circuits (158C) that each have a line width in a range from 2.5 μm to 7.5 μm. The first conductor circuits (158C) having line widths in the range from 2.5 μm to 7.5 μm are referred to as fine wirings (158F). Therefore, when the first conductor layer is formed, manufacturing conditions are set by taking into account the widths and thicknesses of the fine wirings (158F). Therefore, variations in the widths and the thicknesses of the fine wirings (158F) are reduced. When a signal is transmitted using fine wirings (158F), transmission speeds of the fine wirings (158F) are substantially the same. The signal is properly processed. Malfunction does not occur. The processing is not slowed even when an amount of information is large. Therefore, when each of the dedicated wirings (158S) is formed as a fine wiring (158F), complicated processing can be performed in a short time without malfunction.

The first resin insulating layer 150 is formed on the first conductor layer 158 and in the first spaces (SP1) between the first conductor circuits (158C). The first conductor layer has the fine wirings (158F). Therefore, a narrow space (S1N) is formed between each pair of adjacent fine wirings (158F). The narrow spaces (S1N) each have a width of 2.5 μm or more and 7.5 μm or less. When the first conductor layer has the narrow spaces (S1N), it is difficult to fill the narrow spaces with the first resin insulating layer. Suppose the side surfaces (LR, LL) of each of the fine wirings (158F) are roughened, when the first resin insulating layer 150 is filled in the spaces, the rough surfaces that are formed by the roughening act as a resistance. It is difficult to fill the narrow spaces (S1N) with the first resin insulating layer. Insulation reliability between adjacent fine wirings (158F) is reduced. Therefore, when the first conductor layer has the fine wirings (158F) and the narrow spaces (S1N), it is not preferable to roughen the first conductor layer between FIG. 4D and FIG. 4E. That is, the side surfaces (LR, LL) and the lower surface (UN) of the first conductor circuit are not roughened. Roughening is to rough the side surfaces (LR, LL) and the lower surface (UN) of the first conductor circuit using a chemical, blasting, or the like. An example of the chemical is MECetchBOND manufactured by Mec Co. Ltd. An example of an abrasive that is used in blasting is alumina.

When the side surfaces (LR, LL) and the lower surface (UN) of the first conductor circuit are not roughened, the narrow spaces (S1N) are filled with the first resin insulating layer 150. Insulation reliability between adjacent fine wirings (158F) is increased.

The first resin insulating layer is formed of a reinforcing material, inorganic particles and resin. Even when the first resin insulating layer has the reinforcing material, since the first conductor layer is not roughened, the narrow spaces (S1N) can be filled with the inorganic particles and the resin that form the first resin insulating layer. Further, the inorganic particles and the resin that form the first resin insulating layer can be pushed into the narrow spaces (S1N) using the reinforcing material.

When the first conductor layer has the fine wirings (158F) and the narrow spaces (S1N), the side surfaces and the lower surface of the first conductor layer are not roughened. Instead of roughening, an adhesion layer can be formed on the side surfaces (LR, LL) and the lower surface (UN) of the first conductor layer. Due to the adhesion layer, an adhesive force between the side surfaces (LR, LL) of the first conductor layer and the first resin insulating layer 150 is increased. Due to the adhesion layer, an adhesive force between the lower surface (UN) of the first conductor layer and the first resin insulating layer 150 is increased. An example of the adhesion layer is a layer containing a triazine compound or an imidazole compound.

The side surfaces (LR, LL) and the lower surface (UN) of the first conductor layer have an arithmetic average roughness (Ra) of 0.1 μm or more and 0.25 μm or less. Therefore, the first resin insulating layer 150 can be filled in the narrow spaces (S1N).

It is preferable that the first conductor layer have a thickness of 10 μm or less. Since the thickness is thin, the first resin insulating layer 150 can be filled in the narrow spaces (S1N). When the thickness of the first conductor layer is 2 μm or more and 8 μm or less, flatness of the second surface (G) of the first resin insulating layer 150 is increased. Control of impedance is easy.

Figure 5A:
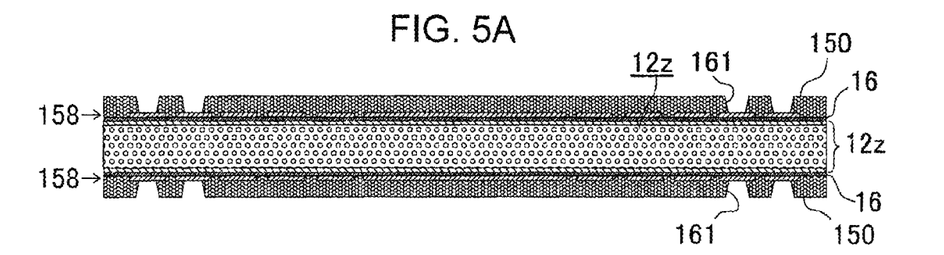
FIG. 5A-5D are process diagrams illustrating the method for manufacturing the printed wiring board of the first embodiment.

The openings 161 for the via conductors that reach the first conductor layer 158 are formed in the first resin insulating layer 150 using $CO_2$ gas laser (FIG. 5A).

An electroless copper plating film 26 is formed on the second surface (G) of the resin insulating layer 150 and on inner walls of the openings 161.

A plating resist is formed on the electroless copper plating film 26.

An electrolytic copper plating film 32 is formed on the electroless copper plating film 26 that is exposed from the plating resist. In this case, the openings 161 are filled with the electrolytic copper plating film 32. The first via conductors 160 are formed in the openings 161.

Figure 5B:
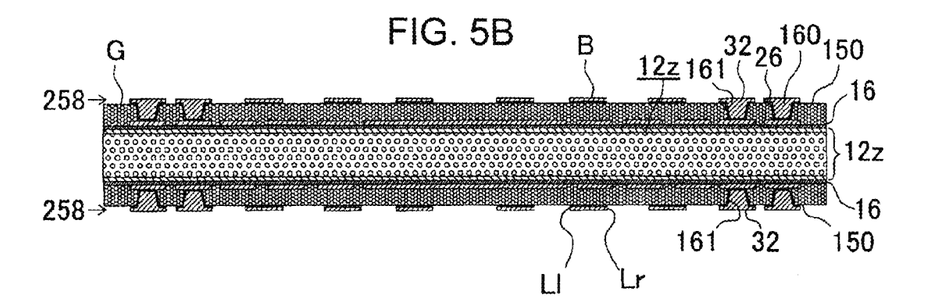
Figure 7B:
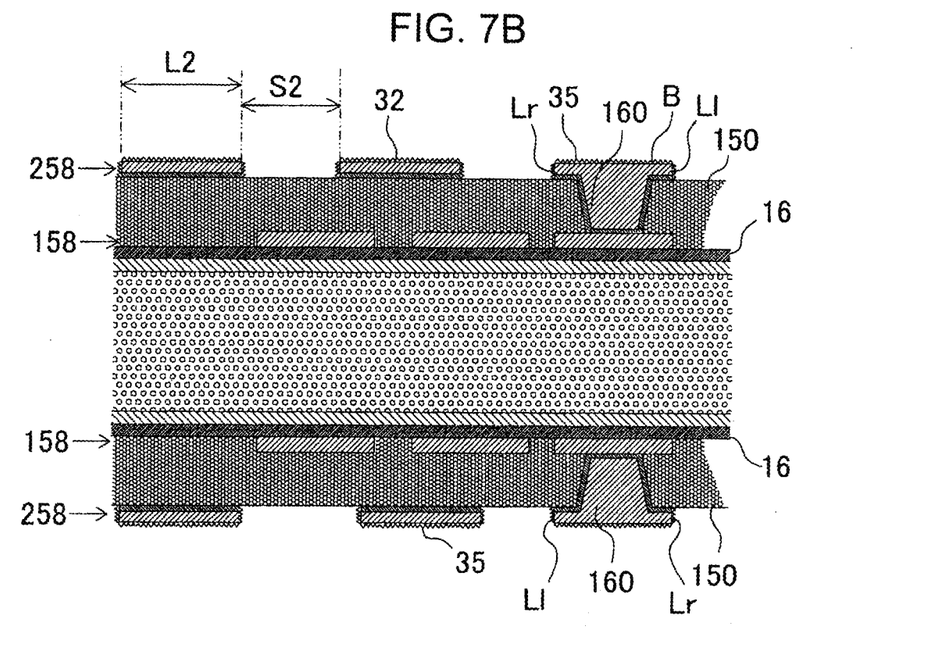
FIG. 7B is an enlarged view of a first conductor layer and a second conductor layer.

The plating resist is removed. The electroless copper plating film 26 that is exposed from the electrolytic copper plating film 32 is removed. The second conductor layer 258 is formed on the second surface (G) of the resin insulating layer 150. The second conductor layer 258 has a thickness of 12 μm or more and 18 μm or less. The second conductor layer is thicker than the first conductor layer. A ratio between the thickness of the second conductor layer and the thickness of the first conductor layer ((the thickness of the second conductor layer)/(the thickness of the first conductor layer)) is in a range from 1.5 to 2.5. The back surface (B) and the side surfaces (LL, LR) of the second conductor layer 258 that includes lands of the first via conductors 160 are roughened (FIG. 5B). Roughening is performed using a chemical, blasting, or the like. A rough surface 35 of FIG. 7B is formed using MECetchBOND manufactured by Mec Co. Ltd.

FIG. 7B illustrates an enlarged view of the first conductor layer 158 and the second conductor layer 258. The second conductor layer has the rough surface 35. However, the first conductor layer 158 does not have a rough surface.

The back surface (B) and the side surfaces (LL, LR) of the second conductor circuits (258C) has an arithmetic average roughness (Ra) of 0.3 μm or more and 0.85 μm or less. The line width (L2M) of the smallest second conductor circuit (258CM) is 10 μm or more and 50 μm or less. Among the second spaces (SP2) between adjacent second conductor circuits, a second space having a smallest width is the smallest second space (SP2M). The width (S2M) of the smallest second space (SP2M) is 10 μm or more and 50 μm or less. The width of the narrowest second space is larger than the width of the narrowest first space.

The second resin insulating layer 250 is formed on the second surface (G) of the first resin insulating layer 150 and on the second conductor layer 258. The widths of the second spaces (SP2) are large. Therefore, even when the second conductor circuits are roughened, the second spaces can be filled with the second resin insulating layer 250. Further, even when the second conductor layer is thick, the second spaces can be filled with resin.

The second resin insulating layer 25 contains a resin such as epoxy, and inorganic particles such as silica. The second resin insulating layer 250 may further contain a reinforcing material such as a glass cloth.

Figure 5C:
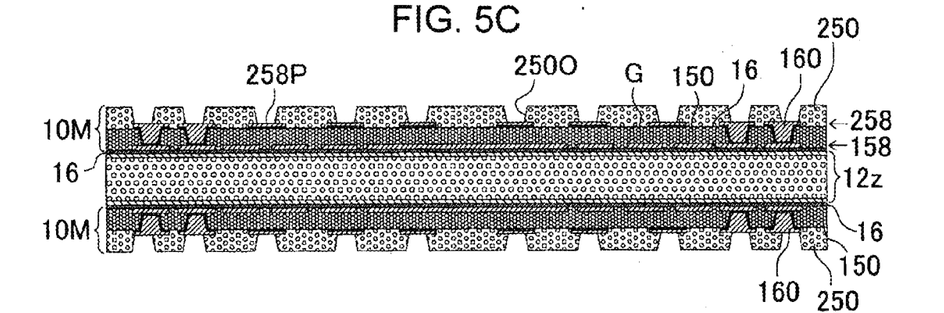

The openings (250O) that expose the second conductor layer 258 are formed in the second resin insulating layer 250 (FIG. 5C). The lower side pads (258P) are exposed. In FIG. 1A, the second resin insulating layer 250 functions as a solder resist layer. As illustrated in FIG. 5C, a middle substrate (10M) that includes the copper foil 16, the first conductor layer 158, the first resin insulating layer 150, the first via conductors 160, the second conductor layer 258 and the second resin insulating layer 250 is formed on the support plate (12z).

Figure 5D:
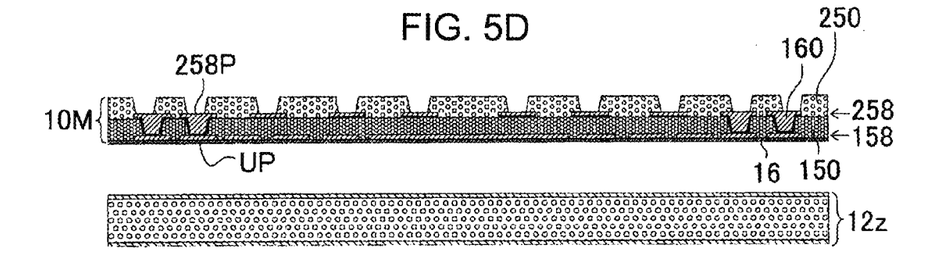

The support plate (12z) and the middle substrate (10M) are separated from each other (FIG. 5D). The copper foil 16 is removed from the middle substrate (10M) by etching. The printed wiring board 10 illustrated in FIG. 1A is completed.

A protective film can be formed on the upper surface (UP) of each of the first conductor circuits (158C) and on each of the lower side pads (258P). Oxidation of the pads is prevented by the protective film. Examples of the protective film include Ni/Au, Ni/Pd/Au and OSP films.

The solder bumps (76Fs, 76Ff) are formed on the upper side pads (158P)

The electronic components (110M, 110L) are mounted on the printed wiring board 10 via the solder bumps (76Ff, 76Fs). The electronic components (110L, 110M) are molded using a molding resin. The first applied example 1001 illustrated in FIG. 2B is completed.

Method for Manufacturing Printed Wiring Board and Second Applied Example

Figure 6A:
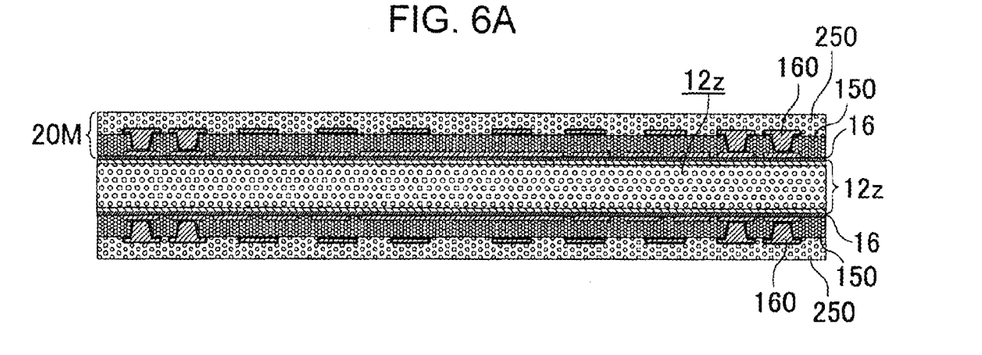
FIG. 6A-6C are process diagrams illustrating a method for manufacturing the printed wiring board of the second embodiment.

FIG. 6A illustrates the support plate (12z) and an intermediate substrate (20M) of the second embodiment on the support plate (12z). The intermediate substrate (20M) is manufactured in the same way as in the first embodiment. When the openings (250O) are formed in the intermediate substrate (20M), the middle substrate (10M) illustrated in FIG. 5C is formed. The intermediate substrate (20M) includes the copper foil 16, the first conductor layer 158, the first resin insulating layer 150, the first via conductors 160, the second conductor layer 258, and the second resin insulating layer 250. The middle substrate (10M) has the openings (250O). However, the intermediate substrate (20M) does not have the openings (250O).

Figure 6B:
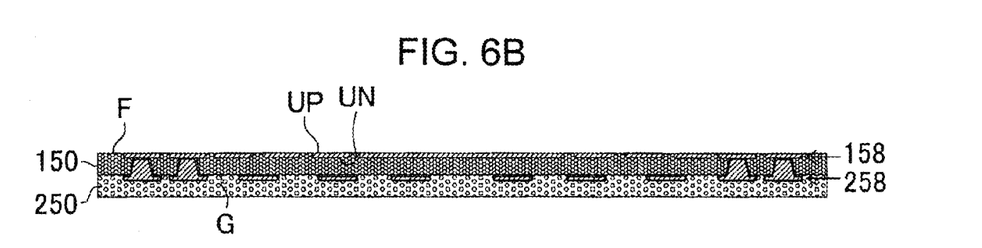

The intermediate substrate (20M) is separated from the support plate (12z). The copper foil 16 is removed from the intermediate substrate (20M) (FIG. 6B). As illustrated in FIG. 6B, the upper surface (UP) of the first conductor layer 158 and the first surface (F) of the first resin insulating layer of the printed wiring board 20 of the second embodiment are exposed. In FIG. 6B, the upper surface (UP) of the first conductor layer 158 and the first surface (F) of the first resin insulating layer are positioned on the same plane. In FIG. 1A, the upper surface (UP) of the printed wiring board 10 of the first embodiment is recessed from the first surface of the first resin insulating layer. However, it is also possible that the upper surface (UP) of the first conductor layer 158 and the first surface of the first resin insulating layer of the printed wiring board 10 of the first embodiment are positioned on the same plane.

Figure 6C:
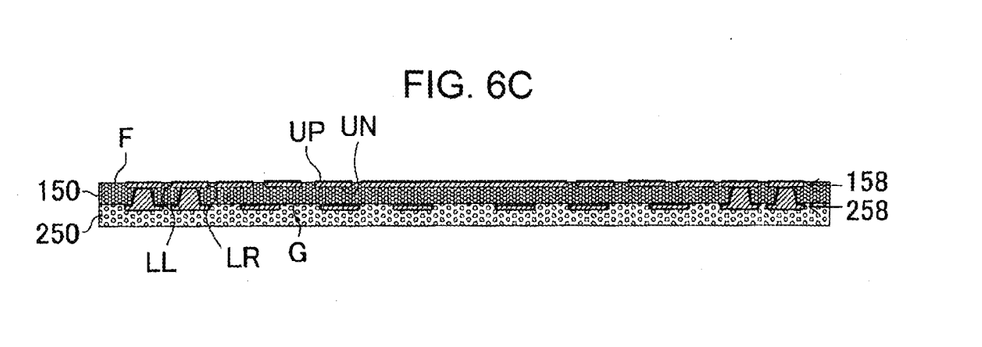

The upper surface (UP) of the first conductor layer 158 is roughened (FIG. 6C). The upper surface (UP) of each of the first conductor circuits (158C) has a rough surface. The side surfaces (LL, LR) and the lower surface (UN) do not have a rough surface.

The third resin insulating layer 350 is laminated on the first surface (F) of the first resin insulating layer 150 and the upper surface (UP) of the first conductor layer 158. A thickness (T3) of the third resin insulating layer and a thickness (T1) of the first resin insulating layer are illustrated in FIG. 3A. The thickness (T3) and the thickness (T1) are distances between adjacent conductor layers. The thickness (T3) is thicker than the thickness (T1). Since the thickness (T3) is thick, the surface (SMF) on which the electronic components (110L, 100M) are mounted is strengthened by the third resin insulating layer 350. Flatness of the mounting surface (SMF) is increased. A printed wiring board that allows an electronic component to be easily mounted is provided. The conductor layers (158, 358) are not embedded in the third resin insulating layer 350. Openings for the second via conductors 260 that reach the upper surface (UP) of the first conductor layer 158 are formed in the third resin insulating layer 350. A seed layer is formed on the third resin insulating layer and in the openings for the second via conductors 260. A plating resist is formed on the seed layer. An electrolytic copper plating film is formed on the seed layer that is exposed from the plating resist. The plating resist is removed. The seed layer that is exposed from the electrolytic copper plating film is removed. The third conductor layer 358 and the second via conductors 260 are formed. The first conductor layer 158 and the third conductor layer 358 are connected by the second via conductors. As illustrated in FIG. 3A, the bottom surface (B) and the side surfaces (LL, LR) of the third conductor layer 358 are roughened. The fourth resin insulating layer 450 is formed on the third conductor layer 358 and the third resin insulating layer 350. The openings (250O) that expose the second conductor layer 258 are formed in the second resin insulating layer 250. Openings (450O) that expose the third conductor layer 358 are formed in the fourth resin insulating layer 450. The printed wiring board 20 illustrated in FIG. 3A is formed. The fourth resin insulating layer 450 functions as an upper side solder resist layer. The second resin insulating layer 250 functions as a lower side solder resist layer. Portions of the third conductor layer 358 that are exposed from the openings (450O) of the upper side solder resist layer 450 function as the upper side pads (358P) for mounting an electronic component. Portions of the second conductor layer 258 that are exposed from the openings (250O) of the lower side solder resist layer 250 function as the lower side pads (258P) for connecting to a motherboard.

When the third resin insulating layer 350 is formed, the first conductor layer 158 is not formed on the first surface (F) of the first resin insulating layer 150. Therefore, even when the third resin insulating layer 350 is formed from a resin film, the third resin insulating layer has a uniform thickness. Control of an impedance of signal lines contained in the first conductor layer 158 is easy. The dedicated wirings are included in the signal lines. In the printed wiring board 20, the third resin insulating layer 350 and the third conductor layer 358 are formed on the first conductor layer. Therefore, the grounds in the third conductor layer can be formed on the signal lines in the first conductor layer 158. Control of an impedance of signal lines contained in the first conductor layer 158 is easy.

A method for manufacturing the second applied example of FIG. 3B is the same as the method for manufacturing the first applied example of FIG. 2A. The solder bumps (76Ff, 76Fs) are formed on the upper side pads of the printed wiring board 20 of FIG. 3A. The electronic components (110M, 110L) are mounted on the printed wiring board 20 via the solder bumps (76Ff, 76Fs). The electronic components (110L, 110M) are molded using a molding resin. The second applied example 1002 illustrated in FIG. 3B is completed.

When pads are formed for external terminals, the diameter of the pads may be about 200-1000 μm; and when a semiconductor element is mounted on the pads, the diameter of the pads may be about 50-150 μm. Then, a high density conductor layer may not be formed by embedding a conductor circuit in an insulating layer.

A printed wiring board according to an embodiment of the present invention is a high density printed wiring board.

A printed wiring board according to an embodiment of the present invention includes: a first resin insulating layer that has a first surface and a second surface that is on an opposite side of the first surface, and has multiple concave portions that are formed on the first surface side; a first conductor layer that includes first conductor circuits that are respectively formed in the concave portions of the first resin insulating layer; a second conductor layer that includes multiple second conductor circuits that are formed on the second surface of the first resin insulating layer; a first via conductor that penetrates the first resin insulating layer and connects the first conductor layer and the second conductor layer; and a second resin insulating layer that is formed on the second surface of the first resin insulating layer and on the second conductor layer. The first conductor circuits each have an upper surface, a lower surface that is on an opposite side of the upper surface, and two side surfaces between the upper surface and the lower surface. The second conductor circuits each have a top surface, a back surface that is on an opposite side of the top surface, and two side surfaces between the top surface and the back surface. The first resin insulating layer is sandwiched by the lower surface of each of the first conductor circuits and the top surface of each of the second conductor circuits. The upper surface is exposed from the first surface. The side surfaces and the lower surface of each of the first conductor circuits are not roughened. The side surfaces and the back surface of each of the second conductor circuits are roughened. A line width (L1) of a thinnest first conductor circuit among the first conductor circuits is smaller than a line width (L2) of a thinnest second conductor circuit among the second conductor circuit.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a first resin insulating layer having a plurality of concave portions formed on a first surface of the first resin insulating layer;
   a first conductor layer comprising a plurality of first conductor circuits formed in the concave portions of the first resin insulating layer, respectively;
   a second conductor layer comprising a plurality of second conductor circuits formed on a second surface of the first resin insulating layer on an opposite side with respect to the first surface of the first resin insulating layer;
   a first via conductor formed in the first resin insulating layer such that the first via conductor is penetrating through the first resin insulating layer and connecting the first conductor layer and the second conductor layer; and
   a second resin insulating layer formed on the second surface of the first resin insulating layer such that the second resin insulating layer is covering the second conductor layer,
   wherein each of the first conductor circuits has an upper surface, a lower surface and two side surfaces between the upper surface and the lower surface such that the upper surface is exposed from the first surface of the first resin insulating layer and that the side surfaces and the lower surface are not roughened surfaces, each of the second conductor circuits has a top surface, a back surface and two side surfaces between the top surface and the back surface such that the side surfaces and the back surface are roughened surfaces, and the plurality of first conductor circuits includes a thinnest first conductor circuit such that the thinnest first conductor circuit has a line width L1 which is smaller than a line width L2 of a thinnest second conductor circuit of the second conductor circuits.

2. A printed wiring board according to claim 1, wherein the plurality of first conductor circuits is formed such that a plurality of first spaces is formed between adjacent first conductor circuits, the plurality of second conductor circuits is formed such that a plurality of second spaces is formed between adjacent second conductor circuits, and the plurality of first spaces includes a narrowest first space such that the narrowest first space has a space S1 which is narrower than a space S2 of a narrowest second space of the second spaces.

3. A printed wiring board according to claim 1, wherein the plurality of first conductor circuits is formed such that the upper surface has a roughened surface.

4. A printed wiring board according to claim 1, wherein the first surface of the first resin insulating layer is formed such that the first surface of the first resin insulating layer is an exposed surface and that each of the first conductor circuits has the upper surface which is an exposed surface.

5. A printed wiring board according to claim 1, further comprising:
   a third resin insulating layer formed on the first surface of the first resin insulating layer; and
   a third conductor layer formed on the third resin insulating layer such that the third conductor layer is protruding from a surface of the third resin insulating layer on an opposite side with respect to the first surface of the first resin insulating layer.

6. A printed wiring board according to claim 5, wherein the first conductor layer and the third conductor layer are formed such that the first conductor layer and the third conductor layer are not embedded into the third resin insulating layer.

7. A printed wiring board according to claim 1, wherein the first resin insulating layer has a mounting surface configured to mount a first electronic component and a second electronic component, and the plurality of first conductor circuits in the first conductor layer is configured to transmit data from the first electronic component to the second electronic component.

8. A printed wiring board according to claim 5, wherein the third resin insulating layer is formed such that the third resin insulating layer has a thickness which is greater than a thickness of the first resin insulating layer.

9. A printed wiring board according to claim 1, wherein the thinnest first conductor circuit of the plurality of first conductor circuits has the line width L1 in a range of 2.5 μm to 7.5 μm.

10. A printed wiring board according to claim 2, wherein the thinnest first conductor circuit of the plurality of first conductor circuits has the line width L1 in a range of 2.5 μm to 7.5 μm, and the narrowest first space of the plurality of first spaces has the space S1 in a range of 2.5 μm to 7.5 μm.

11. A printed wiring board according to claim 5, wherein the third resin insulating layer has a mounting surface configured to mount a first electronic component and a second electronic component, and the plurality of first conductor circuits in the first conductor layer is configured to transmit data from the first electronic component to the second electronic component.

12. A printed wiring board according to claim 2, wherein the plurality of first conductor circuits is formed such that the upper surface has a roughened surface.

13. A printed wiring board according to claim 2, wherein the first surface of the first resin insulating layer is formed such that the first surface of the first resin insulating layer is an exposed surface and that each of the first conductor circuits has the upper surface which is an exposed surface.

14. A printed wiring board according to claim 2, further comprising:
a third resin insulating layer formed on the first surface of the first resin insulating layer; and
a third conductor layer formed on the third resin insulating layer such that the third conductor layer is protruding from a surface of the third resin insulating layer on an opposite side with respect to the first surface of the first resin insulating layer.

15. A printed wiring board according to claim 14, wherein the first conductor layer and the third conductor layer are formed such that the first conductor layer and the third conductor layer are not embedded into the third resin insulating layer.

16. A printed wiring board according to claim 2, wherein the first resin insulating layer has a mounting surface configured to mount a first electronic component and a second electronic component, and the plurality of first conductor circuits in the first conductor layer is configured to transmit data from the first electronic component to the second electronic component.

17. A printed wiring board according to claim 14, wherein the third resin insulating layer is formed such that the third resin insulating layer has a thickness which is greater than a thickness of the first resin insulating layer.

18. A printed wiring board according to claim 2, wherein the thinnest first conductor circuit of the plurality of first conductor circuits has the line width L1 in a range of 2.5 µm to 7.5 µm.

19. A printed wiring board according to claim 13, wherein the thinnest first conductor circuit of the plurality of first conductor circuits has the line width L1 in a range of 2.5 µm to 7.5 µm, and the narrowest first space of the plurality of first spaces has the space S1 in a range of 2.5 µm to 7.5 µm.

20. A printed wiring board according to claim 14, wherein the third resin insulating layer has a mounting surface configured to mount a first electronic component and a second electronic component, and the plurality of first conductor circuits in the first conductor layer is configured to transmit data from the first electronic component to the second electronic component.

* * * * *